(12) United States Patent
Park et al.

(10) Patent No.: US 11,328,766 B2
(45) Date of Patent: May 10, 2022

(54) SEMICONDUCTOR MEMORY DEVICE AND METHOD OF OPERATING THE SAME

(71) Applicant: SK hynix Inc., Icheon-si (KR)

(72) Inventors: Jong Kyung Park, Icheon-si (KR); Ji Hyun Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/922,839

(22) Filed: Jul. 7, 2020

(65) Prior Publication Data

US 2021/0134359 A1 May 6, 2021

(30) Foreign Application Priority Data

Nov. 5, 2019 (KR) .................. 10-2019-0140458

(51) Int. Cl.
*G11C 16/04* (2006.01)
*G11C 11/56* (2006.01)
*G11C 16/10* (2006.01)

(52) U.S. Cl.
CPC ...... *G11C 11/5628* (2013.01); *G11C 11/5671* (2013.01); *G11C 16/0483* (2013.01); *G11C 16/10* (2013.01)

(58) Field of Classification Search
CPC ............ G11C 11/5628; G11C 11/5671; G11C 16/0483; G11C 16/10
See application file for complete search history.

(56) References Cited

U.S. PATENT DOCUMENTS 9,859,014 B2 * 1/2018 Park .................. G11C 16/3459
10,854,296 B2 * 12/2020 Seo ........................ G11C 16/10
10,902,928 B2 * 1/2021 Park ..................... G11C 16/107

FOREIGN PATENT DOCUMENTS

KR     1020160061765 A    6/2016
KR       101798013 B1    11/2017

* cited by examiner

*Primary Examiner* — Pho M Luu
(74) *Attorney, Agent, or Firm* — William Park & Associates Ltd.

(57) ABSTRACT

A semiconductor memory apparatus includes a memory cell array, a peripheral circuit, and control logic. The memory cell array may include a plurality of memory cells. The peripheral circuit performs a program operation on selected memory cells among the plurality of memory cells. The control logic controls an operation of the peripheral circuit. The control logic controls the peripheral circuit to perform a pre-program operation on first memory cells to be programmed to an upper programmed state among the selected memory cells and perform a normal program operation on the selected memory cells after the pre-program operation.

19 Claims, 16 Drawing Sheets

FIG. 11
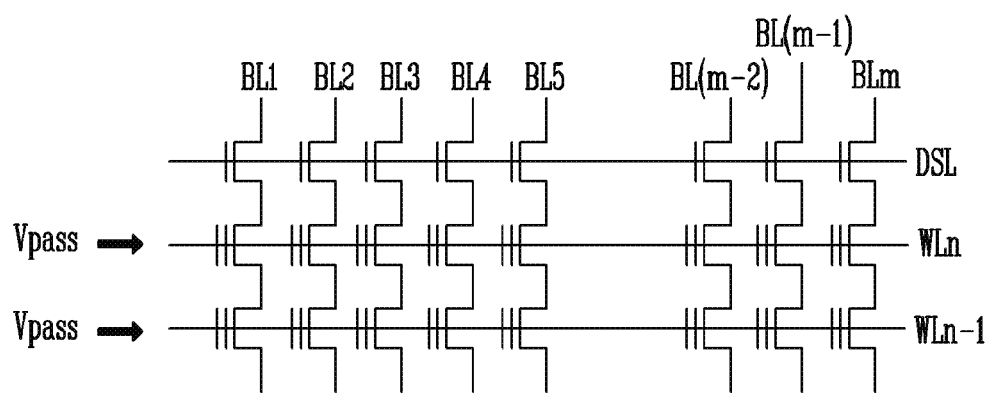
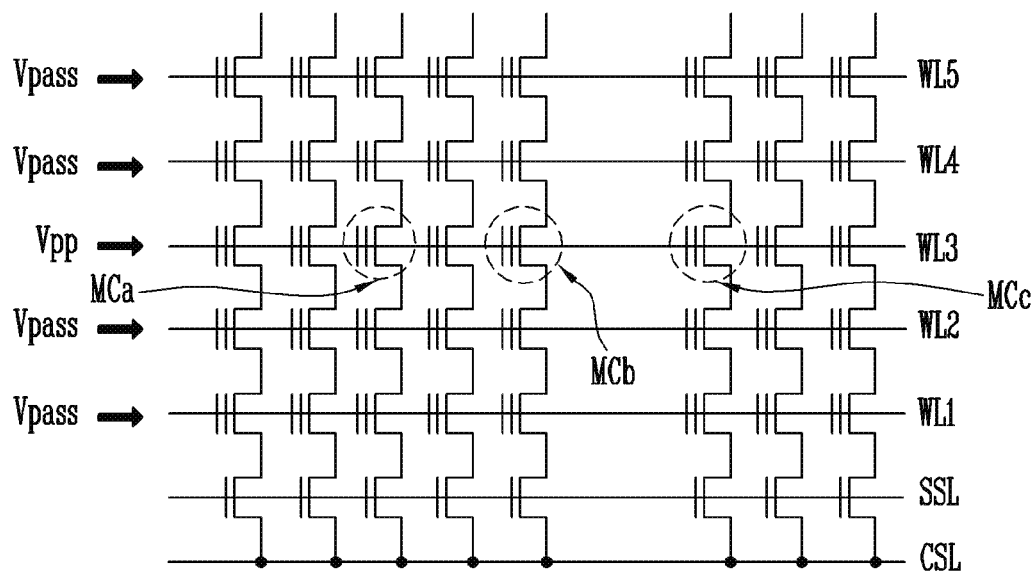

FIG. 17
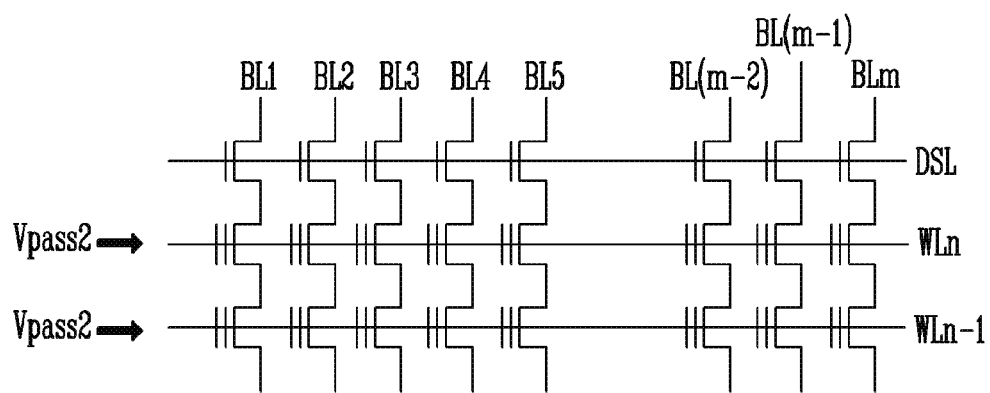
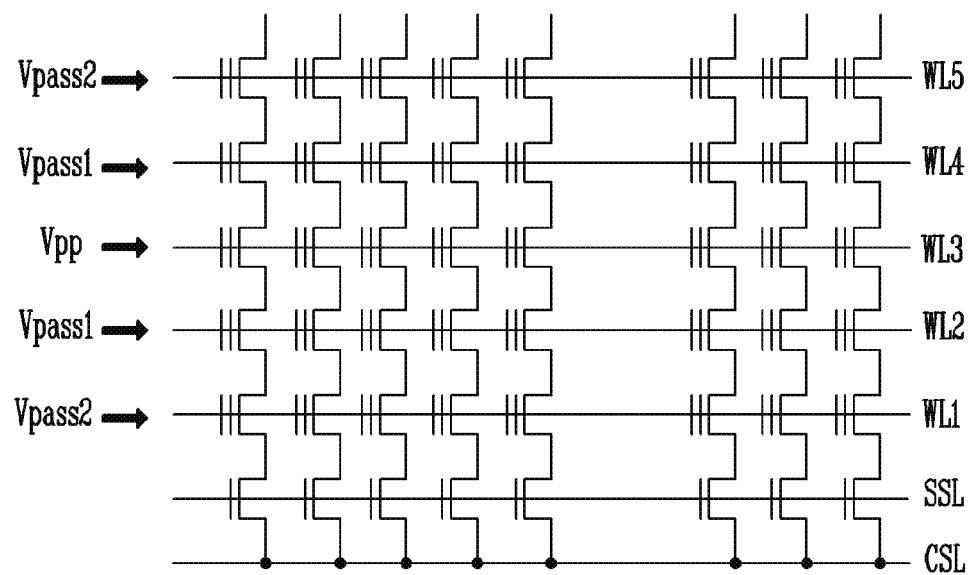

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0140458, filed on Nov. 5, 2019, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor memory device and a method of operating the semiconductor memory device.

2. Related Art

Generally, a memory device may have a two-dimensional structure in which strings are horizontally arranged on a semiconductor substrate, or a three-dimensional structure in which strings are vertically stacked on a semiconductor substrate. The three-dimensional memory device may be a device which is devised to overcome a limitation in the degree of integration of the two-dimensional memory device, and may include a plurality of memory cells which are vertically stacked on a semiconductor substrate.

SUMMARY

Various embodiments of the present disclosure are directed to a semiconductor memory device having enhanced read performance.

Various embodiments of the present disclosure are directed to a method of operating a semiconductor memory device having enhanced read performance.

In accordance with an embodiment of the present disclosure, a semiconductor memory apparatus includes a memory cell array, a peripheral circuit, and control logic. The memory cell array includes a plurality of memory cells. The peripheral circuit performs a program operation on selected memory cells among the plurality of memory cells. The control logic controls an operation of the peripheral circuit. The control logic controls the peripheral circuit to perform a pre-program operation on first memory cells to be programmed to an upper programmed state among the selected memory cells and perform a normal program operation on the selected memory cells after the pre-program operation.

In accordance with an embodiment of the present disclosure, a method of operating a semiconductor memory device including a plurality of memory cells includes: performing a pre-program operation on at least some memory cells included in a selected physical page among the plurality of memory cells; and performing a normal program operation on the memory cells included in the selected physical page. In an embodiment, the performing of the pre-program operation may include pre-programming memory cells to be programmed to an upper programmed state among the memory cells included in the selected physical page.

BRIEF DESCRIPTION OF THE DRAWINGS

FIG. 11 is a diagram for describing an operation of controlling a bit line voltage in a pre-program operation in accordance with an embodiment of the present disclosure.

FIG. 17 is a diagram for describing bit line voltage control in a pre-program operation in accordance with an embodiment of the present disclosure.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Figure 1:
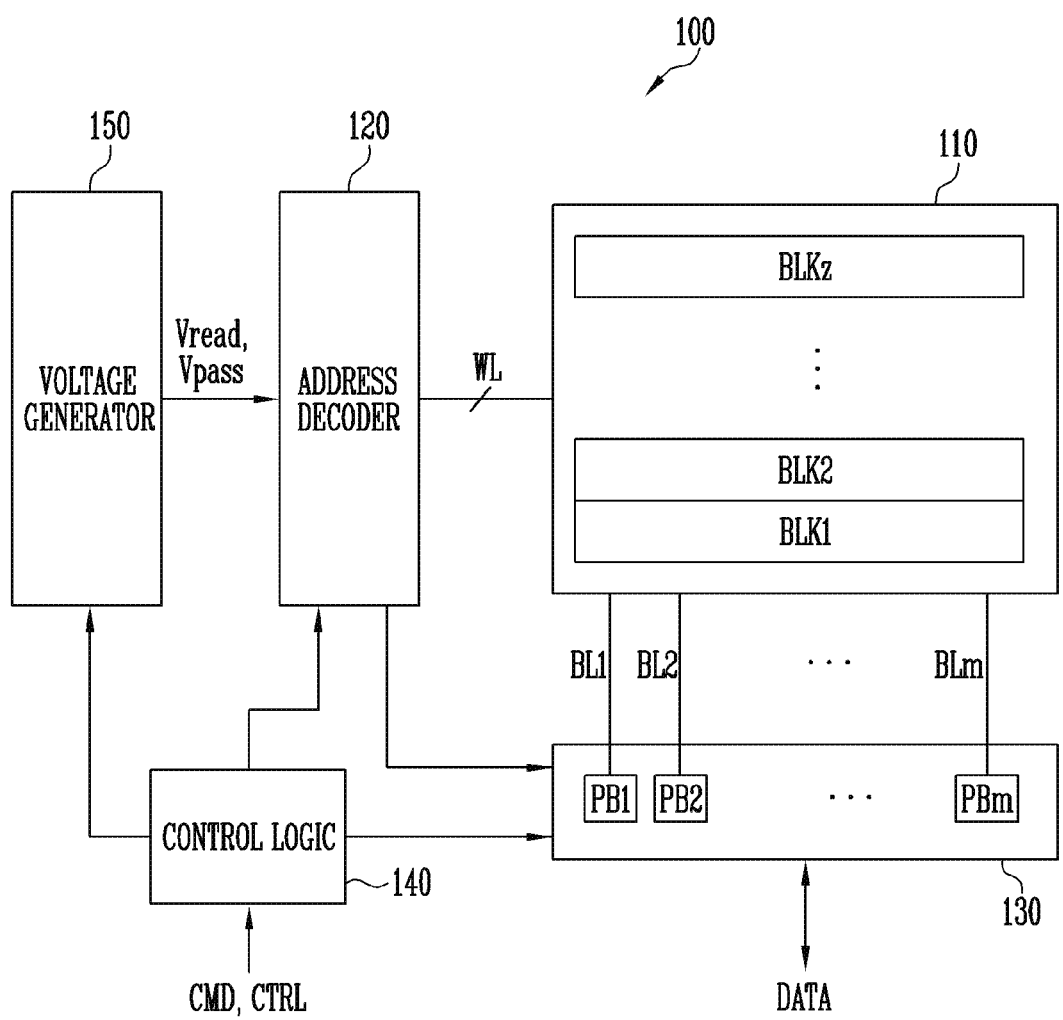
FIG. 1 is a block diagram illustrating a semiconductor memory device in accordance with an embodiment of the present disclosure.

FIG. 1 is a block diagram illustrating a semiconductor memory device 100 in accordance with an embodiment of the present disclosure.

Referring to FIG. 1, the semiconductor memory device 100 includes a memory cell array 110, an address decoder 120, a read/write circuit 130, control logic 140, and a voltage generator 150.

The memory cell array 110 includes a plurality of memory blocks BLK1 to BLKz. The memory blocks BLK1 to BLKz are coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the memory cells may be nonvolatile memory cells and be formed of nonvolatile memory cells having a vertical channel structure. The memory cell array 110 may be formed of a memory cell array having a two-dimensional structure. In an embodiment, the memory cell array 110 may be formed of a memory cell array having a three-dimensional structure.

Each of the memory cells included in the memory cell array may store at least two bits of data. In an embodiment, each of the memory cells included in the memory cell array 110 may be a multi-level cell (MLC), which may store 2-bit data. In an embodiment, each of the memory cells included in the memory cell array 110 may be a triple-level cell (TLC), which may store 3-bit data. In an embodiment, each of the memory cells included in the memory cell array 110 may be a quad-level cell, which may store 4-bit data. In various embodiments, the memory cell array 110 may include a plurality of memory cells each of which may store 5 or more bits of data.

The address decoder 120, the read/write circuit 130, and the voltage generator 150 are operated as peripheral circuits for driving the memory cell array 110. The address decoder 120 may be coupled to the memory cell array 110 through the word lines WL. The address decoder 120 may operate under control of the control logic 140. The address decoder 120 may receive addresses through an input/output buffer (not shown) provided in the semiconductor memory device 100.

The address decoder 120 may decode a block address among the received addresses. The address decoder 120 may select at least one memory block based on the decoded block address. When a read voltage application operation is performed during a read operation, the address decoder 120 may apply a read voltage Vread generated from the voltage generator 150, to a selected word line of a selected memory block and apply a pass voltage Vpass to the other unselected word lines. During a program verify operation, the address decoder 120 may apply a verify voltage generated from the voltage generator 150, to a selected word line of a selected memory block, and apply a pass voltage Vpass to the other unselected word lines.

The address decoder 120 may decode a column address among the received addresses. The address decoder 120 may transmit the decoded column address to the read/write circuit 130.

The read or program operation of the semiconductor memory device 100 is performed on a page basis. Addresses received in a request for a read or program operation may include a block address, a row address and a column address. The address decoder 120 may select one memory block and one word line based on the block address and the row address. The column address may be decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The read/write circuit 130 may be operated as a read circuit during a read operation of the memory cell array 110 and as a write circuit during a write operation. The page buffers PB1 to PBm are coupled to the memory cell array 110 through the bit lines BL1 to BLm. During a read operation or a program verify operation, to sense threshold voltages of the memory cells, the page buffers PB1 to PBm may continuously supply sensing current to the bit lines coupled to the memory cells, and each page buffer may sense, through a sensing node, a change in the amount of flowing current depending on a programmed state of a corresponding memory cell and latch the sensed data as sensing data. The read/write circuit 130 is operated in response to page buffer control signals outputted from the control logic 140.

During a read operation, the read/write circuit 130 may sense data of the memory cells and temporarily store readout data, and then output data to the input/output buffer (not shown) of the semiconductor memory device 100. In an embodiment, the read/write circuit 130 may include a column select circuit or the like as well as the page buffers (or page registers).

The control logic 140 is coupled to the address decoder 120, the read/write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. The control logic 140 may output a control signal for controlling the sensing node precharge potential levels of the plurality of page buffers PB1 to PBm. The control logic 140 may control the read/write circuit 130 to perform a read operation of the memory cell array 110. The control logic 140 may be implemented as hardware, software, or a combination of hardware and software. For example, the control logic 140 may be a control logic circuit operating in accordance with an algorithm and/or a processor executing control logic code.

The voltage generator 150 may generate a read voltage Vread and a pass voltage Vpass during a read operation in response to a voltage generation unit control signal outputted from the control logic 140.

In the semiconductor memory device 100 according to an embodiment of the present disclosure, after a pre-program operation is performed on memory cells corresponding to an upper program state, a normal program operation may be performed in a typical scheme. During the pre-program operation, a predetermined amount of electrons may be trapped in advance in charge storage layers CTN of the memory cells corresponding to the upper program state. The previously trapped electrons may be coupled with holes that are present in the charge storage layers CTN of adjacent memory cells. Thanks to the pre-program operation, holes that are present in boundaries between the memory cells corresponding to the upper program state and memory cells adjacent thereto may be removed in advance. Therefore, a phenomenon in which the threshold voltage of a memory cell programmed to the upper program state is reduced after a program operation is completed may be mitigated. Consequently, the threshold voltage distributions of memory cells after the program operation may be improved, whereby the read performance of the semiconductor memory device may be enhanced.

Figure 2:
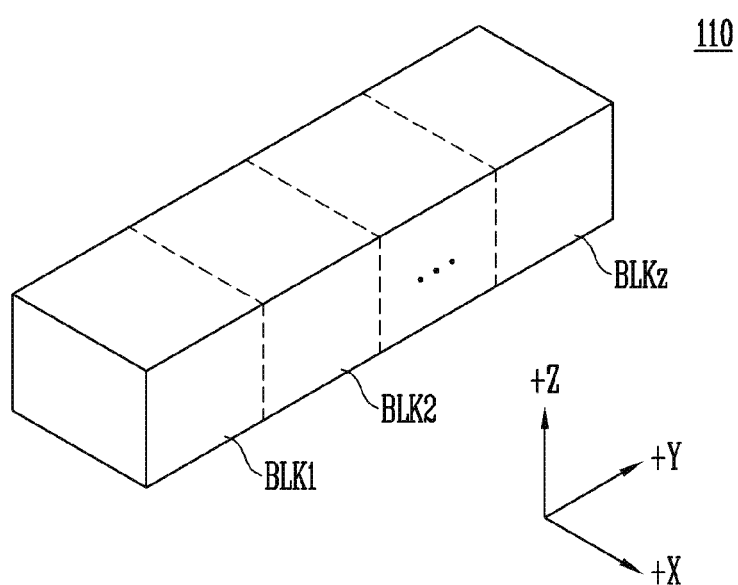
FIG. 2 is a block diagram illustrating a memory cell array of FIG. 1 in accordance with an embodiment of the present disclosure.

FIG. 2 is a block diagram illustrating the memory cell array 110 of FIG. 1 in accordance with an embodiment of the present disclosure.

Referring to FIG. 2, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block having a three-dimensional structure will be described in more detail with reference to FIGS. 4 and 5. Unlike that described in FIG. 2, each memory block of the memory cell array 110 may have a two-dimensional structure. The memory block having the two-dimensional structure will be described in more detail with reference to FIG. 3.

Figure 3:
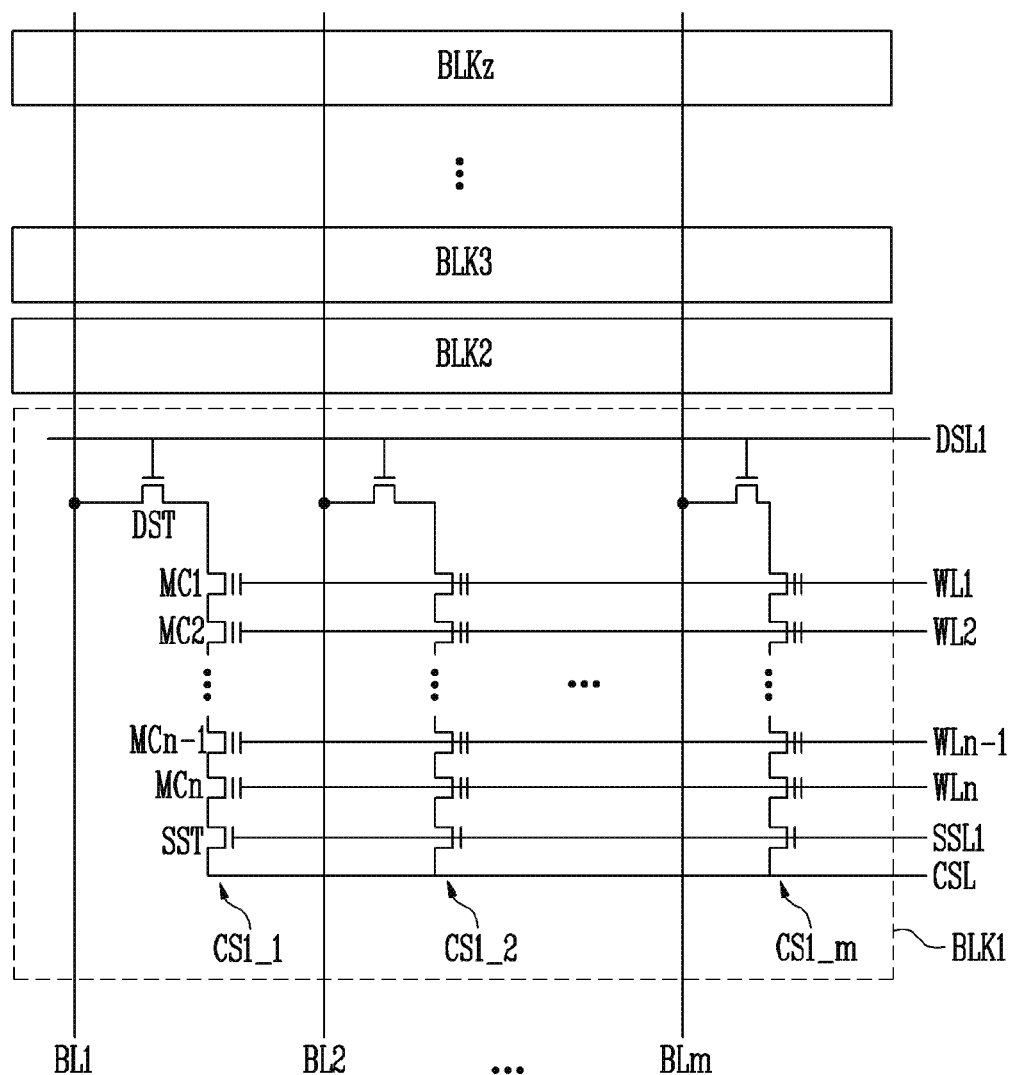
FIG. 3 is a block diagram illustrating a memory cell array of FIG. 1 in accordance with an embodiment of the present disclosure.

FIG. 3 is a diagram illustrating an example (110_1) of the memory cell array 110 of FIG. 1.

Referring to FIG. 3, first to z-th memory blocks BLK1 to BLKz included in a memory cell array 110_1 are coupled in common to first to m-th bit lines BL1 to BLm. In FIG. 3, for the sake of explanation, elements of only the first memory block BLK1 among the plurality of memory blocks BLK1 to BLKz are illustrated, and illustration of elements of each of the other memory blocks BLK2 to BLKz is omitted. It may be understood that each of the memory blocks BLK2 to BLKz has the same configuration as that of the first memory block BLK1.

The memory block BLK1 includes a plurality of cell strings CS1_1 to CS1_$m$. The first to m-th cell strings CS1_1 to CS1_$m$ are respectively coupled to the first to m-th bit lines BL1 to BLm.

Each of the first to m-th cell strings CS1_1 to CS1_$m$ includes a drain select transistor DST, a plurality of memory cells MC1 to MCn coupled in series to each other, and a source select transistor SST. The drain select transistor DST is coupled to a drain select line DSL1. The first to n-th memory cells MC1 to MCn are respectively coupled to first to n-th word lines WL1 to WLn. The source select transistor SST is coupled to a source select line SSL1. A drain of the drain select transistor DST is coupled to the corresponding bit line. The drain select transistors DST of the first to m-th cell strings CS1_1 to CS1_$m$ are respectively coupled to the first to m-th bit lines BL1 to BLm. A source of the source select transistor SST is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are controlled by the address decoder 120. The common source line CSL is controlled by the control logic 140. The first to m-th bit lines BL1 to BLm are controlled by the read/write circuit 130.

As shown in FIG. 3, the memory cell array 110 of the semiconductor memory device 100 in accordance with an embodiment of the present disclosure may be formed of the memory cell array 110_1 having a two-dimensional structure. However, in various embodiments, the memory cell array 110 of the semiconductor memory device 100 may be formed of a memory cell array having a three-dimensional structure. The memory cell array having a three-dimensional structure will be described herein below with reference to FIGS. 4 and 5.

Figure 4:
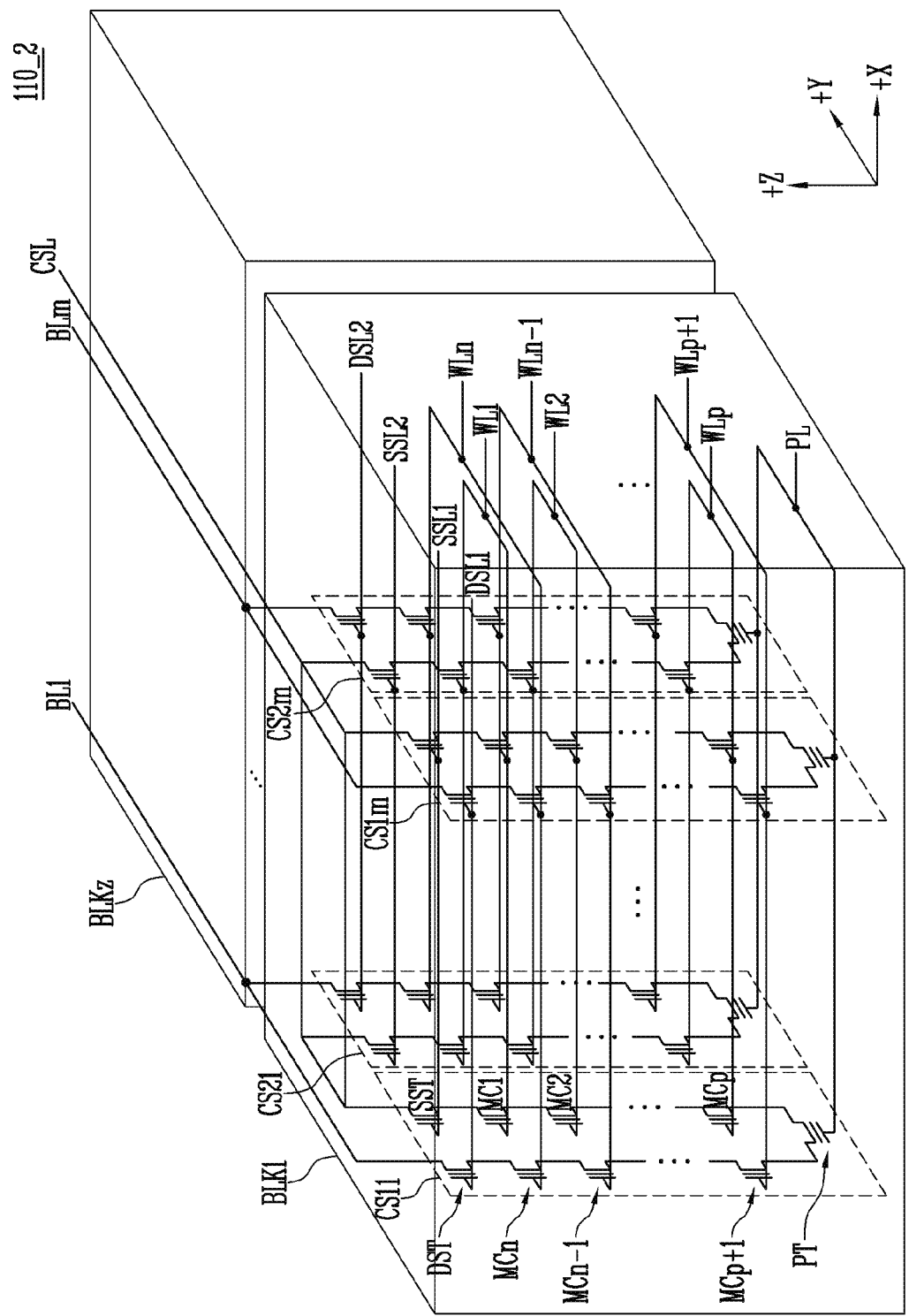
FIG. 4 is a diagram illustrating an example of the memory cell array 110 of FIG. 1.

FIG. 4 is a diagram illustrating an example (110_2) of the memory cell array 110 of FIG. 1.

Referring to FIG. 4, a memory cell array 110_2 includes a plurality of memory blocks BLK1 to BLKz. In FIG. 4, for the sake of description, the internal configuration of the first memory block BLK1 is illustrated, and the internal configuration of each of the other memory blocks BLK2 to BLKz is omitted. It may be understood that each of the second to z-th memory blocks BLK2 to BLKz has the same configuration as that of the first memory block BLK1.

Referring to FIG. 4, the first memory block BLK1 includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the first memory block BLK1, m cell strings are arranged in a row direction (i.e., the +X direction). In FIG. 4, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1$m$ and CS21 to CS2$m$ may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1$m$ in a first row are coupled to a first source select line SSL1. Source select transistors of the cell strings CS21 to CS2$m$ in a second row are coupled to a second source select line SSL2.

In an embodiment, the source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1$m$ in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

Figure 5:
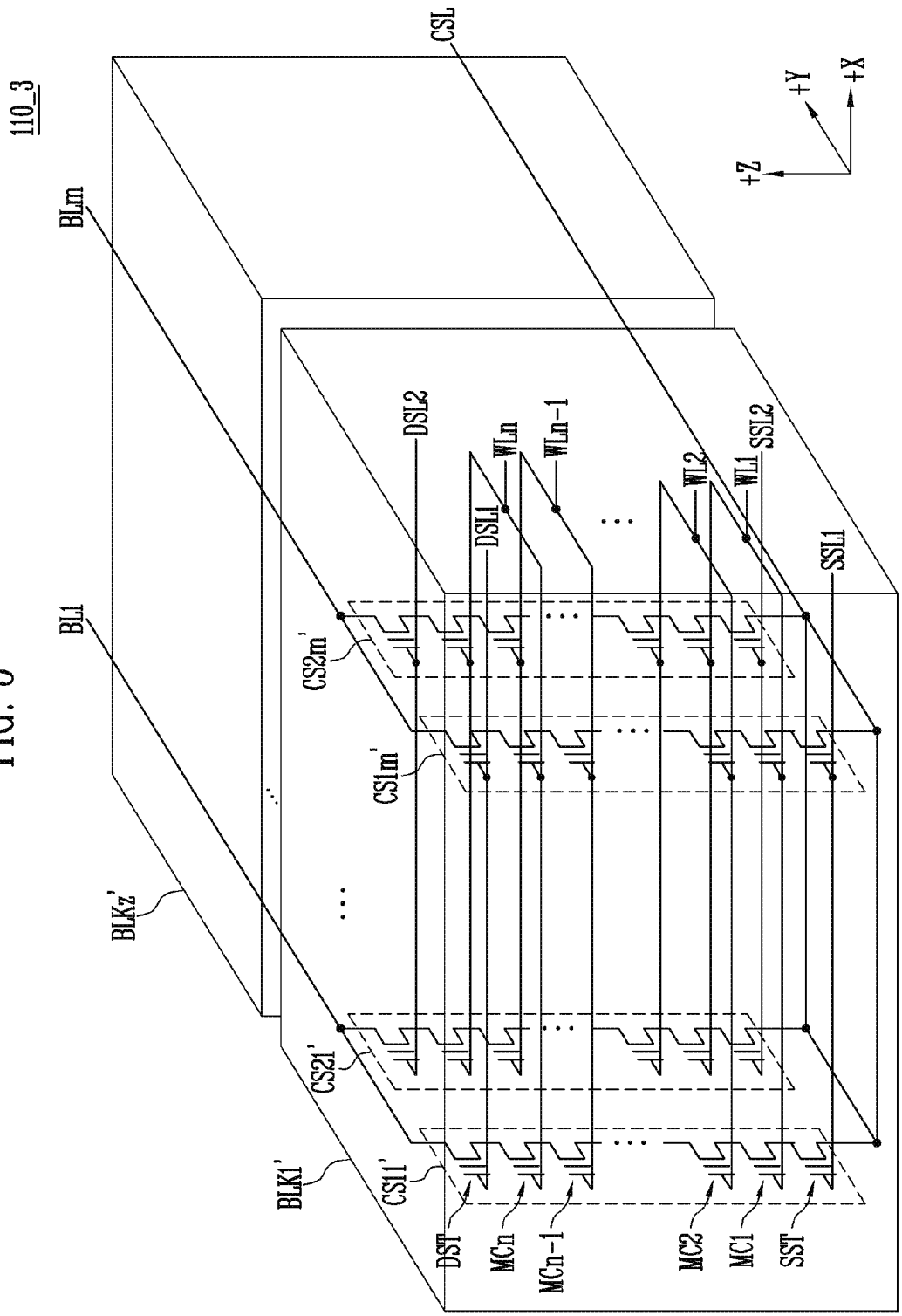
FIG. 5 is a diagram illustrating an example of the memory cell array 110 of FIG. 1.

FIG. 5 is a diagram illustrating an example (110_3) of the memory cell array 110 of FIG. 1.

Referring to FIG. 5, a memory cell array 110_3 includes a plurality of memory blocks BLK1' to BLKz'. In FIG. 5, for the sake of description, the internal configuration of the first memory block BLK1' is illustrated, and the internal configuration of each of the other memory blocks BLK2' to BLKz' is omitted. It will be understood that each of the second to z-th memory blocks BLK2' to BLKz' has the same configuration as that of the first memory block BLK1'.

The first memory block BLK1' includes a plurality of cell strings CS11' to CS1m' and CS21' to CS2m'. Each of the cell strings CS11' to CS1m' and CS21' to CS2m' extends in the +Z direction. In the first memory block BLK1, m cell strings are arranged in the +X direction. In FIG. 4, two cell strings are illustrated as being arranged in a +Y direction. However, this illustration is made only for convenience of description, and it will be understood that three or more cell strings may be arranged in the column direction.

Each of the cell strings CS11' to CS1m' and CS21' to CS2m' includes at least one source select transistor SST, first to n-th memory cells MC1 to MCn, and at least one drain select transistor DST.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

As a result, the memory block BLK1' of FIG. 5 has an equivalent circuit similar to that of the memory block BLK1 of FIG. 4 except that a pipe transistor PT is excluded from each cell string.

Figure 6:
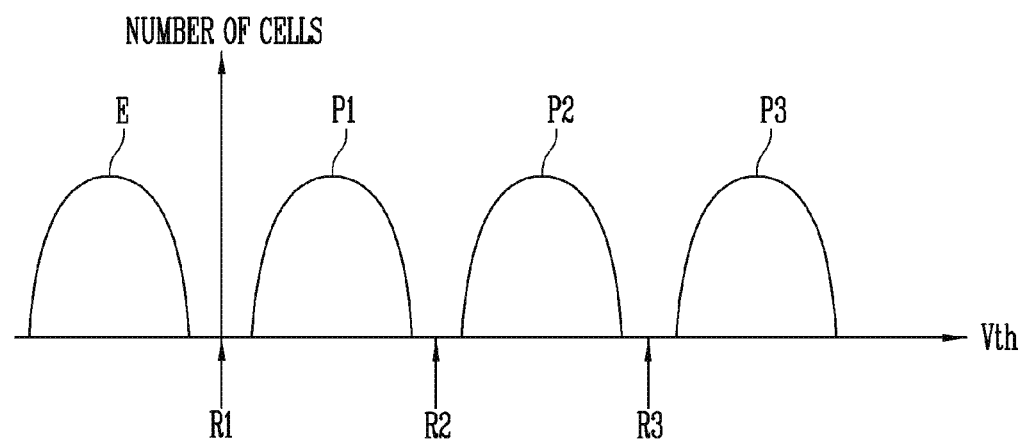
FIG. 6 is a diagram illustrating threshold voltage distributions of multi-level cells.

FIG. 6 is a diagram illustrating threshold voltage distributions of multi-level cells. Referring to FIG. 6, each of the memory cells may be programmed from an erased state E to any one state of a first programmed state P1, a second programmed state P2, and a third programmed state P3, depending on data stored in the corresponding memory cells.

Figure 7:
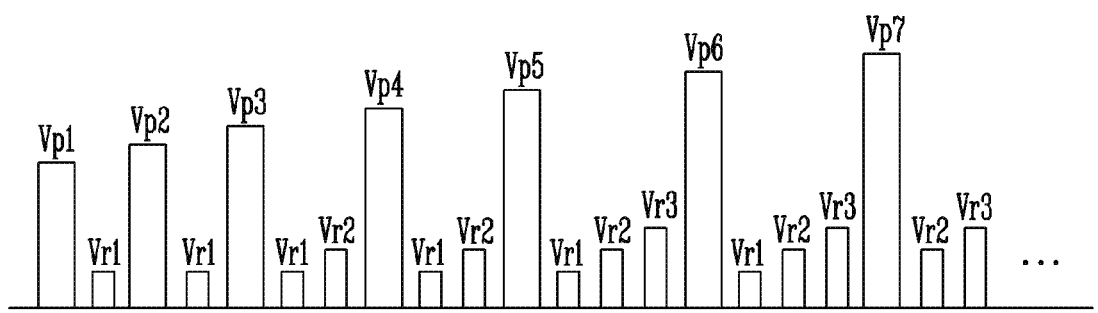
FIG. 7 is a diagram for describing an operation of programming memory cells.

FIG. 7 is a diagram for describing an operation of programming memory cells. Referring to FIG. 7, there is illustrated a program operation that is performed in an incremental step pulse program (ISPP) manner. Voltage pulses illustrated in FIG. 7 may be applied to a word line coupled with memory cells that are selected as targets to be programmed.

The program operation may include a plurality of program loops. Each of the program loops may include the step of increasing the threshold voltages of the memory cells by applying a program pulse to the memory cells, and the step of performing a program verify operation on the memory cells by applying verify voltages to the memory cells. FIG. 7 illustrates seven program loops. During a first program loop, a first program pulse Vp1 may be applied to a word line coupled with selected memory cells, in other words, to a select word line. Thereafter, a first verify voltage Vr1 may be applied to the selected memory cells to verify the memory cells to be programmed to a first programmed state P1. Because the first program loop corresponds to an early stage of the program operation, there is no need to perform verify operations for second and third programmed states P2 and P3 that are higher programmed states. Therefore, as illustrated in FIG. 7, during the first program loop, a verify operation for only the first programmed state P1 may be performed. A second program loop may also be performed in the same manner as that of the first program loop.

Referring to FIG. 7, during a third program loop, first and second verify voltages Vr1 and Vr2 may be applied to the selected word line to perform verify operations for the first and second programmed states P1 and P2. During a fifth program loop, first to third verify voltages Vr1, Vr2, and Vr3 may be applied to the selected word line to perform verify operations for the first to third programmed states P1, P2, and P3. As a result of verification of a sixth program loop, the verification for the first programmed state P1 may pass. Consequently, from the seventh program loop, the verify operation for the first programmed state P1 might not be performed, so that the first verify voltage Vr1 might not be applied to the word line.

Figure 8A:
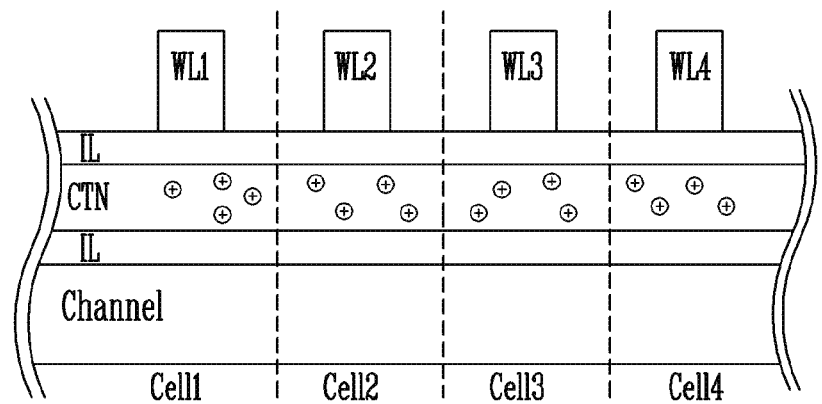
FIGS. 8A, 8B, and 8C are diagrams for describing a change in threshold voltage of a memory cell that occurs during a read operation immediately after a program operation.
Figure 8B:
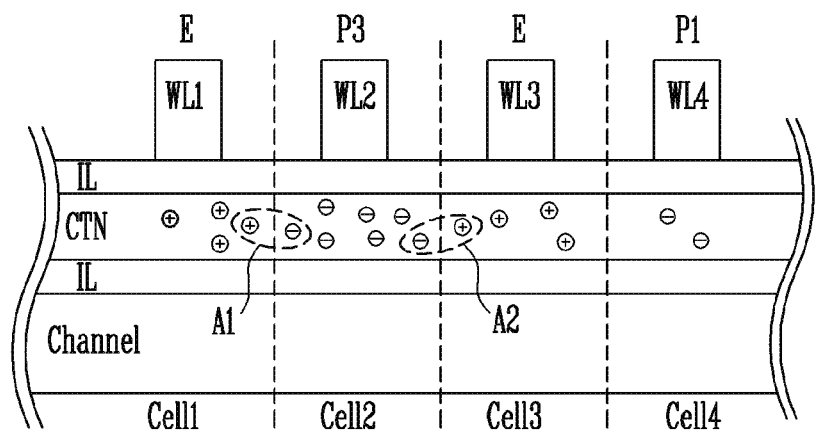
Figure 8C:
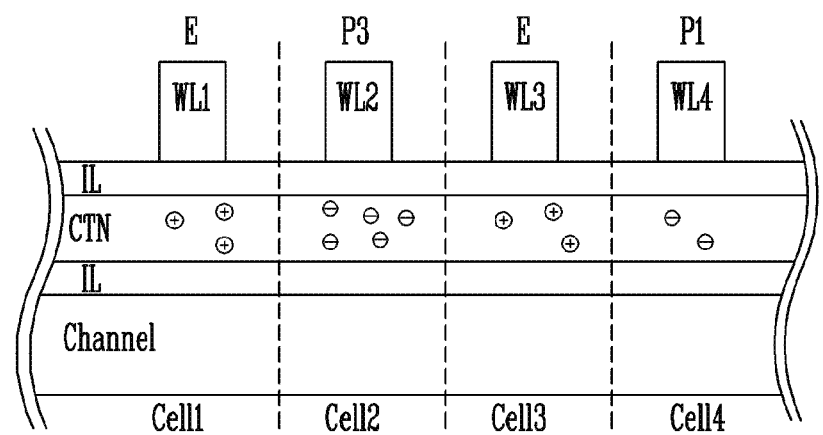

FIGS. 8A, 8B, and 8C are diagrams for describing a change in threshold voltage of a memory cell that occurs during a read operation immediately after a program operation.

Referring to FIGS. 8A to 8C, there are illustrated partial sectional views of a memory cell string having a three-dimensional structure. As illustrated in FIGS. 8A to 8C, the memory cell string may have a structure in which a channel layer Channel, an insulating layer IL, a charge storage layer CTN, an insulating layer IL, and a word line WL are sequentially stacked. FIGS. 8A to 8C illustrate only a portion of the entire sectional structure of the memory cell string for the sake of explanation.

Furthermore, for the sake of explanation, four word lines WL1 to WL4 among a plurality of word lines are illustrated. The word lines WL1 to WL4 may be respectively coupled to memory cells Cell1, Cell2, Cell3, and Cell4 that are formed by the insulating layers IL, the charge storage layer CTN, and the channel layer Channel that are provided in the corresponding areas.

FIG. 8A illustrates charge characteristics of the charge storage layer CTN immediately after an erase operation. Immediately after the erase operation, the charge storage layer CTN may include no electron. In addition, immediately after the erase operation, the charge storage layer CTN may include a plurality of holes. In FIG. 8A, the holes are illustrated as positive charges.

FIG. 8B illustrates charge characteristics of the charge storage layer CTN and horizontal migration of charges immediately after the program operation. Referring to FIG. 8B, it may be understood that the first and third memory cells Cell1 and Cell3 remain in the erased state E, the second memory cell Cell2 has been programmed to the third programmed state P3, and the fourth memory cell Cell4 has been programmed to the first programmed state P1.

In the case of the first and third memory cells Cell1 and Cell3, the charge storage layer CTN may include holes. Therefore, the first and third memory cells Cell1 and Cell3 each may have a threshold voltage corresponding to the erased state E that is comparatively low.

The charge storage layers CTN of the second and fourth memory cells Cell2 and Cell4 may include electrons. The second memory cell Cell2 is programmed to the third programmed state P3 that is comparatively high, and the fourth memory cell Cell4 is programmed to the first programmed state P1 that is comparatively low. Therefore, the number of electrons included in the charge storage layer CTN of the second memory cell Cell2 may be greater than the number of electrons included in the charge storage layer CTN of the fourth memory cell Cell4.

After the program operation, charges that are present in boundary lines between cells may affect adjacent cells. Referring to FIG. 8B, electrons and holes that are present in boundary areas A1 and A2 may be coupled to each other. Hence, as illustrated in FIG. 8C, the number of electrons included in the charge storage layer CTN of the second memory cell Cell2 that has been programmed to the third programmed state P3 may be slightly reduced. Because the number of electrons included in the charge storage layer CTN of the second memory cell Cell2 is reduced, the threshold voltage of the second memory cell Cell2 may be reduced. In the case of the fourth memory cell Cell4, the number of electrons included in the charge storage layer CTN is small, so that the number of electrons that are present around the boundary lines with an adjacent memory cell is also smaller than that of the second memory cell Cell2. Hence, in the case of the fourth memory cell, there is little change in threshold voltage.

As a process of manufacturing the semiconductor memory device is miniaturized, the distance between the memory cells is also reduced. Therefore, as illustrated in FIG. 8A, the amount of holes that are trapped in the charge storage layer of the boundary areas between the memory cells may be increased during the erase operation. After the program operation, electrons that are trapped in the charge storage layer of a memory cell may be coupled with holes that are trapped in the charge storage layer of an adjacent memory cell. This causes a problem in that the threshold voltage of the programmed memory cell may be changed. The foregoing problem may occur in different ways by programmed states P1 to P3. Particularly, in the case of a memory cell of an upper programmed state, e.g., the third programmed state P3, a threshold voltage degradation phenomenon that is caused by the foregoing problem may be exacerbated.

Figure 9:
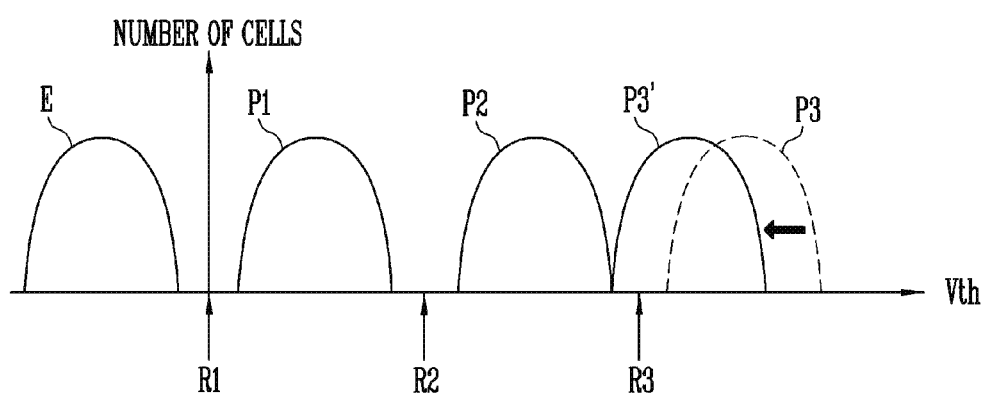
FIG. 9 is a diagram illustrating threshold voltage degradation described with reference to FIGS. 8A to 8C.

FIG. 9 is a diagram illustrating threshold voltage degradation described with reference to FIGS. 8A to 8C.

Referring to FIG. 9, each of the memory cells may be programmed from an erased state E to any one state of a first programmed state P1, a second programmed state P2, and a third programmed state P3, depending on data stored in the corresponding memory cells. Thereafter, as described with reference to FIGS. 8B and 8C, the threshold voltages of memory cells corresponding to the third programmed state may be migrated from distribution P3 to distribution P3'. This may lead to degradation in read margin for the third read voltage R3.

In the semiconductor memory device and a method of operating the same according to an embodiment of the present disclosure, after a pre-program operation is performed on memory cells corresponding to an upper program state, a normal program operation may be performed in a typical scheme. During the pre-program operation, a predetermined amount of electrons may be trapped in advance in charge storage layers CTN of the memory cells corresponding to the upper program state. The previously trapped electrons may be coupled with holes that are present in the charge storage layers CTN of adjacent memory cells. Thanks to the pre-program operation, holes that are present in boundaries between the memory cells corresponding to the upper program state and memory cells adjacent thereto may be removed in advance. Therefore, a phenomenon in which, as illustrated in FIG. 8B, the threshold voltage of a memory cell is reduced after a program operation is completed may be mitigated. Consequently, the threshold voltage distributions of memory cells after the program operation may be improved, whereby the read performance of the semiconductor memory device may be enhanced.

Figure 10:
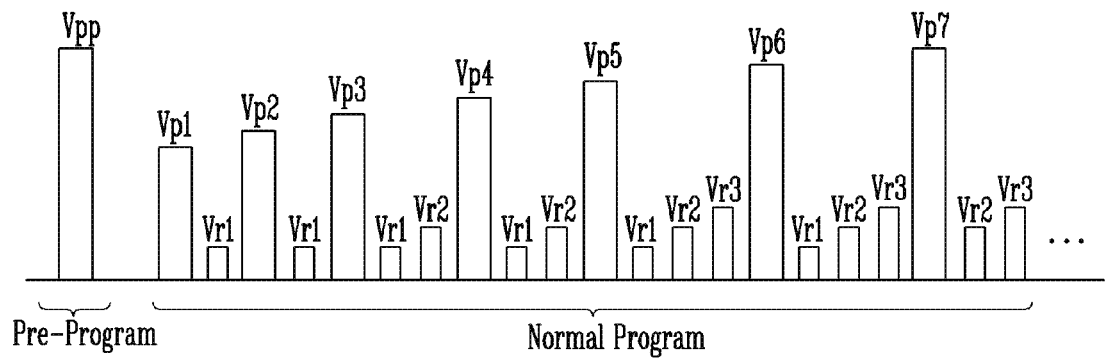
FIG. 10 is a diagram for describing a program operation of the semiconductor memory device in accordance with an embodiment of the present disclosure.

FIG. 10 is a diagram for describing a program operation of the semiconductor memory device in accordance with an embodiment of the present disclosure.

Referring to FIG. 10, a pre-program operation may be performed at an early stage of the program operation, and a normal program may be thereafter performed. During the pre-program operation, a pre-program pulse Vpp may be applied to a word line coupled with memory cells selected as targets to be programmed. The pre-program pulse Vpp may be greater than the first program pulse Vp1. In an embodiment, the pre-program pulse Vpp may have a value ranging from 16 V to 20 V.

Subsequently, during the normal program operation, as described with reference to FIG. 7, the program operation may be performed in the ISPP scheme.

During the pre-program operation, while the pre-program pulse Vpp is applied to the selected word line, a bit line voltage may be controlled to have effects resulting from the application of the pre-program pulse Vpp on only memory cells to be programmed to an upper programmed state. The operation of controlling the bit line voltage during the application of the pre-program pulse Vpp will be described below with reference to FIG. 11.

FIG. 11 is a diagram for describing the operation of controlling the bit line voltage in the pre-program operation in accordance with an embodiment of the present disclosure.

Referring to FIG. 11, there is illustrated a structure of a memory block including memory cells that are targets of a program operation. The memory cells that are targets of the program operation may be memory cells coupled with a third word line WL3. Memory cells MCa, MCb, MCc to be programmed to the third programmed state P3 among the memory cells coupled with the third word line WL3 are indicated by dotted-line circles.

During the pre-program operation, a pre-program pulse Vpp may be applied to the word line WL3 coupled with selected memory cells that are the targets to be programmed. Program pass voltages Vpass may be applied to unselected word lines WL1, WL2 and WL4 to WLn. Because the program pass voltage Vpass is applied to the unselected word lines WL1, WL2, and WL4 to Wn, memory cells coupled with the unselected word lines might not be programmed regardless of the voltages of the bit lines BL1 to BLm.

During the pre-program operation, a program enable voltage may be applied to each of bit lines coupled with memory cells to be pre-programmed among the selected memory cells, and program inhibit voltages may be applied to bit lines coupled with the other memory cells. The program inhibit voltage is a voltage higher than the program enable voltage. For example, the program enable voltage may be a ground voltage (0V). For instance, the program inhibit voltage may be a power supply voltage. In an embodiment illustrated in FIG. 11, program enable voltages may be applied to bit lines BL3, BL5, . . . , BL(m−2) that are respectively coupled with the memory cells MCa, MCb, and MCc. The program inhibit voltages may be applied to the other bit lines BL1, BL2, BL4, . . . , BL(m−1), and BLm.

In an embodiment of the present disclosure, the memory cells MCa, MCb, and MCc to be pre-programmed may be memory cells to be programmed to the third programmed state P3. As described above, the reason for this is because, in the case of the memory cells programmed to the third programmed state P3 that is the highest programmed state, there is the probability of reduction in threshold voltage because electrons may be lost from boundaries with adjacent cells. In an embodiment, memory cells to be programmed to the second and third programmed states P2 and P3 may be pre-programmed. In an embodiment, memory cells to be programmed to the first to third programmed states P1, P2, and P3 may be pre-programmed.

Figure 12:
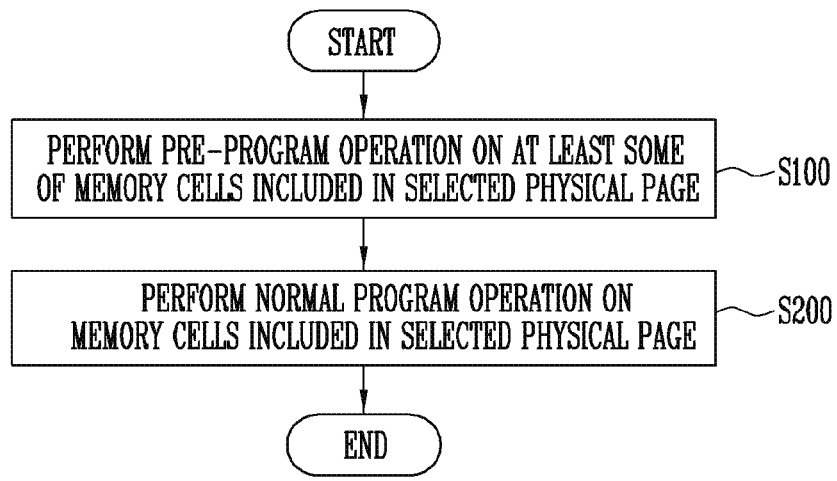
FIG. 12 is a flowchart illustrating a method of operating the semiconductor memory device in accordance with an embodiment of the present disclosure.

FIG. 12 is a flowchart illustrating a method of operating the semiconductor memory device in accordance with an embodiment of the present disclosure.

Referring to FIG. 12, in the method of operating the semiconductor memory device in accordance with an embodiment of the present disclosure, a pre-program operation may be performed on at least some of memory cells included in a selected physical page (at step S100), and a normal program operation may be performed on memory cells included in the selected physical page (at step S200). In the present specification, the term "physical page" may refer to a group of memory cells coupled to a single word line. A physical page formed of multi-level cells described with reference to FIG. 9 may include two logical pages.

Referred to FIG. 12 together with FIG. 10, a pre-program operation may be performed by applying a pre-program pulse Vpp to a word line selected at step S100, and a normal-program operation including a plurality of program loops may be performed at step S200. A detailed embodiment of step S100 will be described below with reference to FIGS. 13 to 15.

Figure 13:
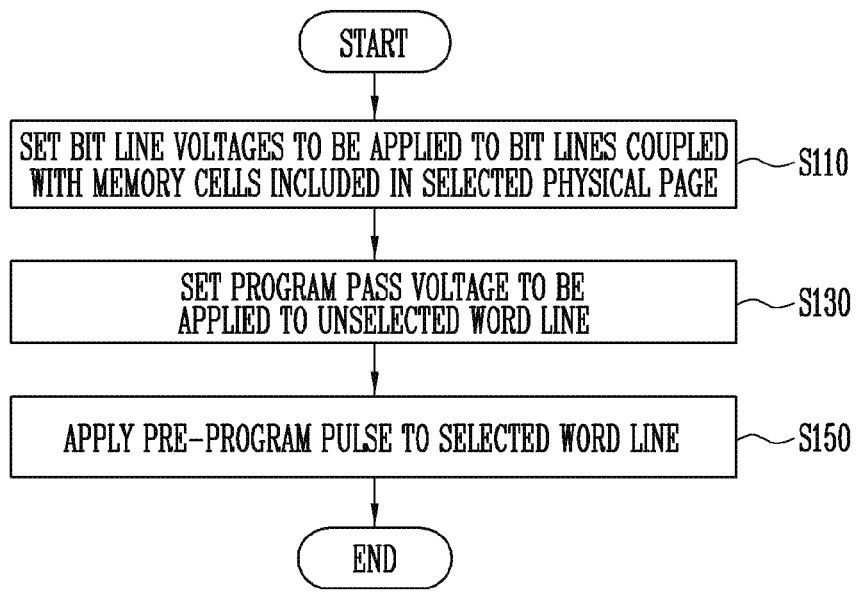
FIG. 13 is a flowchart illustrating in detail an operation of FIG. 12.

FIG. 13 is a flowchart illustrating in detail step S100 of FIG. 12.

Referring to FIG. 13, step S100 may include step S110 of setting bit line voltages to be applied to bit lines coupled with the memory cells included in the selected physical page, step S130 of setting program pass voltages to be applied to unselected word lines, and step S150 of applying a pre-program pulse to the selected word line.

At step S110, bit line voltages for the memory cells on which the pre-program operation is to be performed among the memory cells included in the selected physical page may be set, and bit line voltages for the other memory cells may be set. As described with reference to FIG. 11, a program enable voltage may be applied to each of the bit lines coupled with the memory cells on which the pre-program operation is to be performed, and program inhibit voltages may be applied to bit lines coupled to the other memory cells on which the pre-program operation is not to be performed. A detailed embodiment of step S110 will be described later with reference to FIG. 14.

At step S130, the program pass voltage to be applied to each of the unselected word lines may be set. The unselected word lines may be word lines other than the select word line coupled with the memory cells that are targets of the program operation. Referring to FIG. 11, the first and second word lines WL1 and WL2 and the fourth to n-th word lines WL4 to WLn may be unselected word lines. At step S130, the program pass voltage Vpass may be applied to each of the unselected word lines. A detailed embodiment of step S130 will be described later with reference to FIGS. 15 and 18.

Although FIG. 13 illustrates that step S130 is performed after step S110 has been performed, the method of operating the semiconductor memory device according to the present disclosure is not limited thereto. In an embodiment, step S110 may be performed after step S130 has been performed. In an embodiment, at least portions of steps S110 and S130 may be simultaneously performed.

Thereafter, at step S150, the pre-program pulse may be applied to the select word line. The select word line may be a word line coupled with the memory cells that are target to be programmed. In an embodiment of FIG. 11, the select word line may be the third word line WL3. As the pre-program pulse is applied to the select word line, holes that are trapped in the charge storage layer CTN in boundaries areas between memory cells corresponding to an upper programmed state among the selected memory cells and memory cells adjacent to the corresponding memory cells may be removed. Therefore, a phenomenon in which the threshold voltages of memory cells corresponding to the upper program state are reduced after the normal program operation may be mitigated. Therefore, the read margin between the programmed states may be increased, so that the read performance of the semiconductor memory device may be enhanced.

Figure 14:
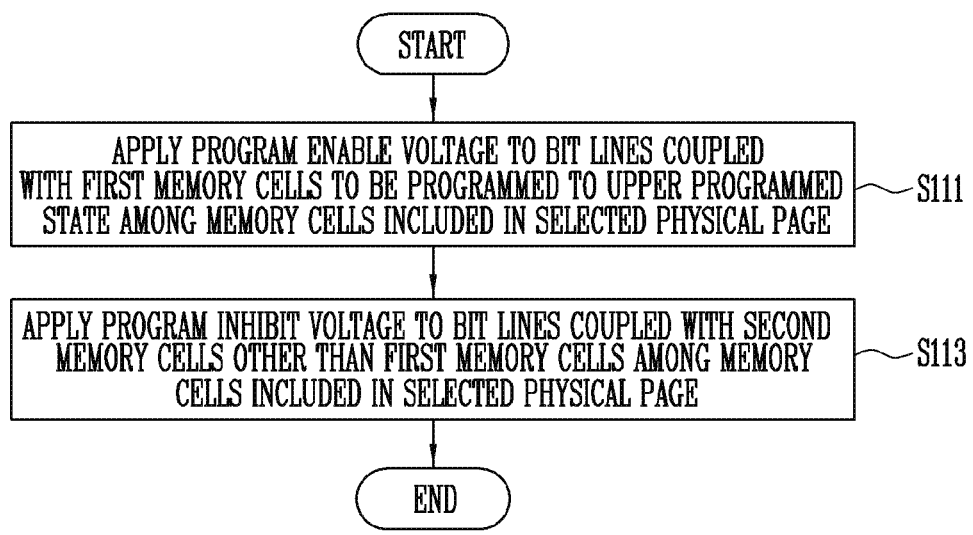
FIG. 14 is a flowchart illustrating in detail an operation of FIG. 13.

FIG. 14 is a flowchart illustrating in more detail an embodiment of step S110 of FIG. 13. Referring to FIG. 14, step S110 may include step S111 of applying program enable voltages to bit lines coupled to first memory cells to be programmed to an upper programmed state among the memory cells included in the selected physical page, and step S113 of applying program inhibit voltages to bit lines coupled with second memory cells other than the first memory cells among the memory cells included in the selected physical page.

At step S111, the program enable voltages may be applied to the bit lines coupled with the first memory cells. The first memory cells may be memory cells to be programmed to the upper programmed state. In an embodiment illustrated in FIG. 11, the first memory cells may be the memory cells MCa, MCb, and MCc to be programmed to the third programmed state P3. Hence, at step S111, the program enable voltages may be applied to the bit lines BL3, BL5, . . . , BL(m−2) that are respectively coupled with the memory cells MCa, MCb, and MCc.

At step S113, the program inhibit voltages may be applied to the bit lines coupled with the second memory cells. The second memory cells may be memory cells other than the first memory cells among the memory cells selected as the targets to be programmed. Hence, at step S113, the program inhibit voltages may be applied to the bit lines BL1, BL2, BL4, . . . , BL(m−1), and BLm.

Although FIG. 14 illustrates that step S113 is performed after step S111 has been performed, the method of operating the semiconductor memory device according to the present disclosure is not limited thereto. In an embodiment, step S111 may be performed after step S113 has been performed. In an embodiment, at least portions of steps S111 and S113 may be simultaneously performed.

Figure 15:
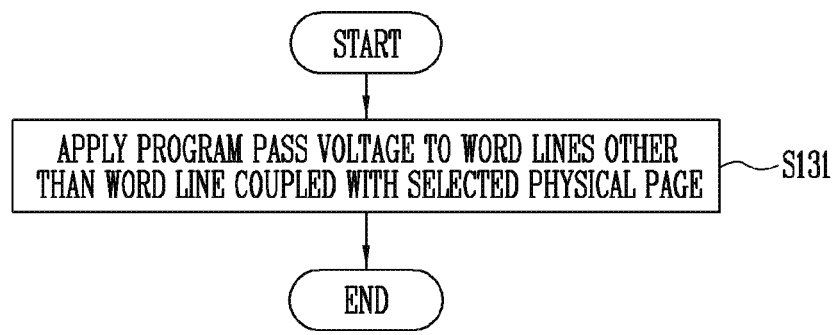
FIG. 15 is a flowchart illustrating in detail an operation of FIG. 13.

FIG. 15 is a flowchart illustrating in more detail an embodiment of step S130 of FIG. 13. Referring to FIG. 15, step S130 may include step S131 of applying program pass voltages to word lines other than the word line coupled with the selected physical page. Referring to FIG. 15 together with FIG. 11, the program pass voltages may be applied to the word lines WL1, WL2, and WL4 to WLn other than the third word line WL3 that is the select word line. The program pass voltage Vpass may be a voltage having a level lower than that of the pre-program pulse Vpp.

Figure 16:
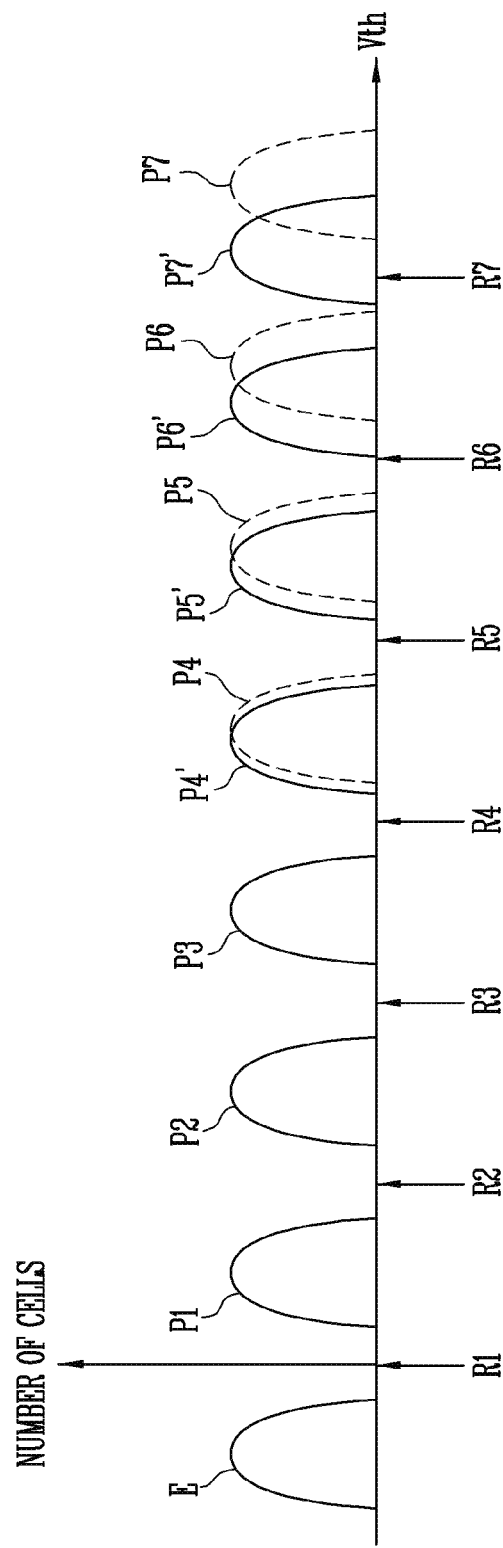
FIG. 16 is a diagram illustrating threshold voltage degradation of triple-level cells.

FIG. 16 is a diagram illustrating threshold voltage degradation of triple-level cells. FIG. 16 illustrates threshold voltage distributions of triple-level cells capable of storing three bits, and threshold voltage distributions formed by degradation of the normal threshold voltage distributions.

In a manner similar to the multi-level cells, in the case of the triple-level cells, a threshold voltage degradation phenomenon may also occur on memory cells programmed to the upper programmed state for the same reason as that described with reference to FIGS. 8A to 8C. In an embodiment illustrated in FIG. 16, immediately after a first program operation, memory cells may have a distribution E indicating an erased state and distributions P1 to P7 respectively indicating first to seventh programmed states. Thereafter, due to the phenomenon described with reference to FIG. 8B, threshold voltage distributions corresponding to fourth to seventh programmed states that are upper programmed states may be migrated from distributions P4, P5, P6, and P7 to degraded distributions P4', P5', P6', and P7'. This may lead to degradation in lead margin for fourth to seventh read voltages R4 to R7.

According to the semiconductor memory device and the method of operating the same in accordance with an embodiment of the present disclosure, in the case of the triple-level cells, in the same manner as the multi-level cells, a typical normal program operation may be performed after the pre-program operation has been performed on the memory cells corresponding to the upper program state. In this case, the upper programmed state may be the seventh programmed state P7. In an embodiment, the upper programmed state may include the sixth and seventh programmed states P6 and P7. In an embodiment, the upper programmed state may include the fifth to seventh programmed states P5 to P7. In an embodiment, the upper programmed state may include the fourth to seventh programmed states P4 to P7. In an embodiment, the upper programmed state may include the third to seventh programmed states P3 to P7. In an embodiment, the upper programmed state may include the second to seventh programmed states P2 to P7. In an embodiment, the upper programmed state may include the first to seventh programmed states P1 to P7.

FIG. 17 is a diagram for describing bit line voltage control in a pre-program operation in accordance with an embodiment of the present disclosure.

Referring to FIG. 17, there is illustrated a structure of a memory block including memory cells that are targets of a program operation. In a manner similar to the embodiment of FIG. 11, the memory cells that are targets of the program operation may be memory cells coupled with a third word line WL3.

During the pre-program operation, a pre-program pulse Vpp may be applied to the word line WL3 coupled with selected memory cells that are the targets to be programmed. A first program pass voltage Vpass1 may be applied to each of unselected word lines WL2 and WL4 that are disposed adjacent to the select word line WL3. A second program pass voltage Vpass1 may be applied to each of unselected word lines WL1 and WL5 to WLn that are not adjacent to the select word line WL3.

In the case of the embodiment illustrated in FIG. 11, the same program pass voltage Vpass may be applied to all of the unselected word lines regardless of the distance from the select word line WL3. In the case of the embodiment of FIG. 17, the first program pass voltage Vpass1 may be applied to the unselected word lines WL2 and WL4 that are adjacent to the select word line WL3, and the second program pass voltage Vpass2 may be applied to the other unselected word lines WL1 and WL5 to WLn.

In an embodiment, the voltage level of the first program pass voltage Vpass1 may be greater than the voltage level of the second program pass voltage Vpass2. In the case where the first program pass voltage Vpass1 having a comparatively high voltage level is applied to each of the unselected word lines WL2 and WL4 adjacent to the select word line WL3, electrons may be more easily trapped in boundary areas between a memory cell to be programmed to an upper programmed state among selected memory cells and memory cells adjacent thereto during a pre-program operation. Thus, during the pre-program operation, holes that are present in the boundary areas between the memory cell to be programmed to the upper programmed state among the selected memory cells and the memory cells adjacent thereto may be more easily removed. Consequently, after a normal program operation, a threshold voltage degradation phenomenon of memory cells programmed to the upper programmed states may be mitigated. As a result, the read performance of the semiconductor memory device 100 may be enhanced.

Figure 18:
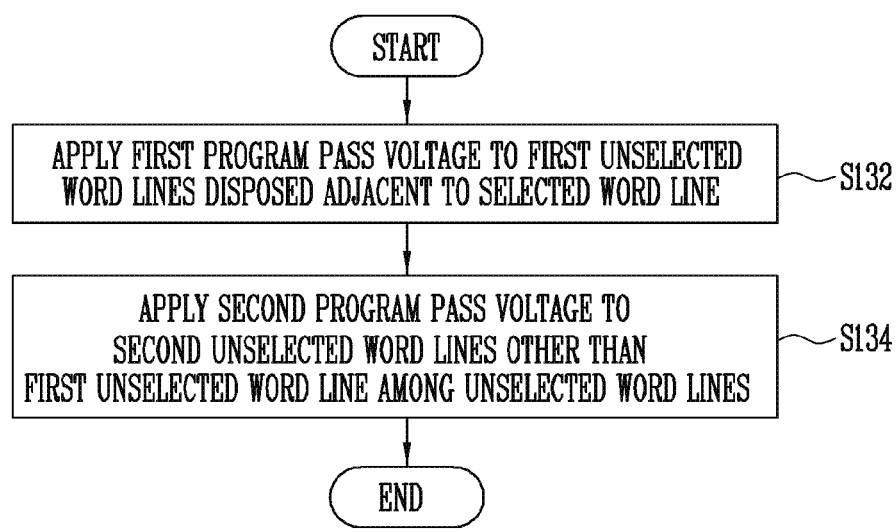
FIG. 18 is a flowchart illustrating in detail an operation of FIG. 13.

FIG. 18 is a flowchart illustrating in more detail an embodiment of step S130 of FIG. 13. Referring to FIG. 18, step S130 may include step S132 of applying a first program pass voltage to first unselected word lines disposed adjacent to a select word line, and step S134 of applying a second program pass voltage to second unselected word lines other than the first unselected word line among unselected word lines.

As described with reference to FIG. 17, at step S132, the first program pass voltage Vpass1 may be applied to the first unselected word lines WL2 and WL4 disposed adjacent to the selected word line WL3. At step S134, the second program pass voltage Vpass2 may be applied to the second unselected word lines WL1 and WL5 to WLn that are the other unselected word lines. In an embodiment, the voltage level of the first program pass voltage Vpass1 may be greater than the voltage level of the second program pass voltage Vpass2.

Although FIG. 18 illustrates that step S134 is performed after step has been performed, the method of operating the semiconductor memory device according to the present disclosure is not limited thereto. In an embodiment, step S132 may be performed after step S134 has been performed. In an embodiment, at least portions of steps S132 and S134 may be simultaneously performed.

Figure 19:
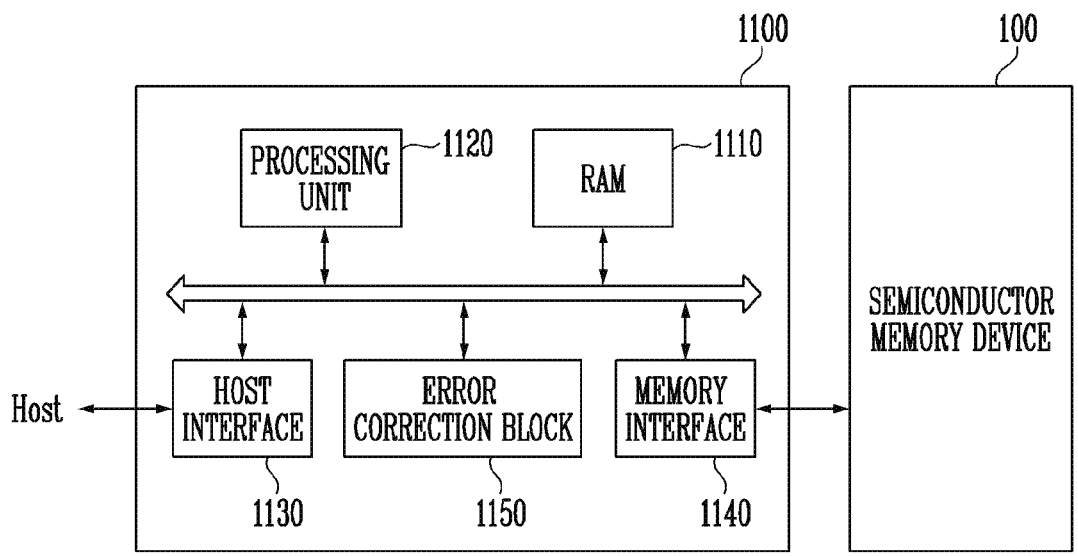
FIG. 19 is a block diagram illustrating a memory system including the semiconductor memory device of FIG. 1.

FIG. 19 is a block diagram illustrating a memory system including the semiconductor memory device of FIG. 1.

Referring to FIG. 19, the memory system 1000 includes the semiconductor memory device 100 and a controller 1100. The semiconductor memory device 100 may have the same configuration and operation as those of the semiconductor memory device described with reference to FIG. 1. Hereinafter, repetitive explanations will be omitted.

The controller 1100 is coupled to a host and the semiconductor memory device 100. The controller 1100 may access the semiconductor memory device 100 in response to a request from the host. For example, the controller 1100 may control a read operation, a write operation, an erase operation, and a background operation of the semiconductor memory device 100. The controller 1100 may provide an interface between the semiconductor memory device 100 and the host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operating memory for the processing unit 1120, a cache memory between the semiconductor memory device 100 and the host, and a buffer memory between the semiconductor memory device 100 and the host. The processing unit 1120 may control the overall operation of the controller 1100. In addition, the controller 1100 may temporarily store program data provided from the host during the write operation.

The host interface 1130 may include a protocol for performing data exchange between the host and the controller 1100. In an embodiment, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1140 may interface with the semiconductor memory device 100. For example, the memory interface may include a NAND interface or a NOR interface.

The error correction block 1150 may use an error correcting code (ECC) to detect and correct an error in data received from the semiconductor memory device 100. The processing unit 1120 may control the semiconductor memory device 100 to adjust the read voltage according to an error detection result from the error correction block 1150 and perform re-reading. In an embodiment, the error correction block 1150 may be provided as a component of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMC-micro), a SD card (SD, miniSD, microSD, or SDHC), and a universal flash storage (UFS).

The controller 1100 and the semiconductor memory device 100 may be integrated into a single semiconductor device to form a solid state drive (SSD). The SSD may include a storage device configured to store data in a semiconductor memory. When the memory system 1000 is used as the SSD, the operating speed of the host coupled to the memory system 2000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 20:
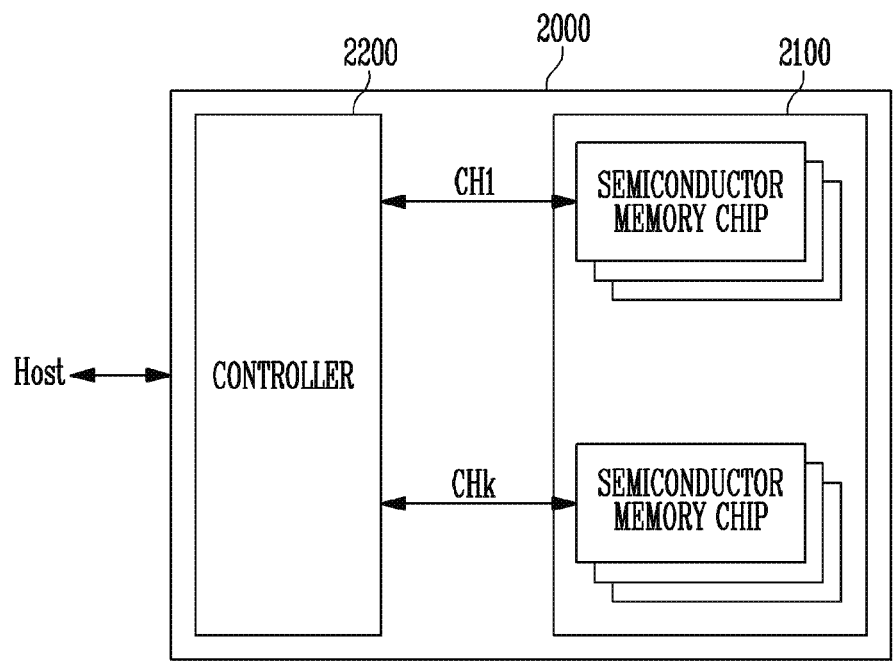
FIG. 20 is a block diagram illustrating an example of an application of the memory system of FIG. 19.

FIG. 20 is a block diagram illustrating an example of application of a memory system of FIG. 19.

Referring FIG. 20, a memory system 2000 may include a semiconductor memory device 2100 and a controller 2200. The semiconductor memory device 2100 may include a plurality of semiconductor memory chips. The semiconductor memory chips are divided into a plurality of groups.

In FIG. 20, it is illustrated that the respective groups communicate with the controller 2200 through first to k-th channels CH1 to CHk. Each semiconductor memory chip may have the same configuration and operation as those of a component of the semiconductor memory device 100 described with reference to FIG. 1.

Each group may communicate with the controller 2200 through one common channel. The controller 2200 may have the same configuration as that of the controller 1100 described with reference to FIG. 19 and control a plurality of memory chips of the semiconductor memory device 2100 through the plurality of channels CH1 to CHk.

Figure 21:
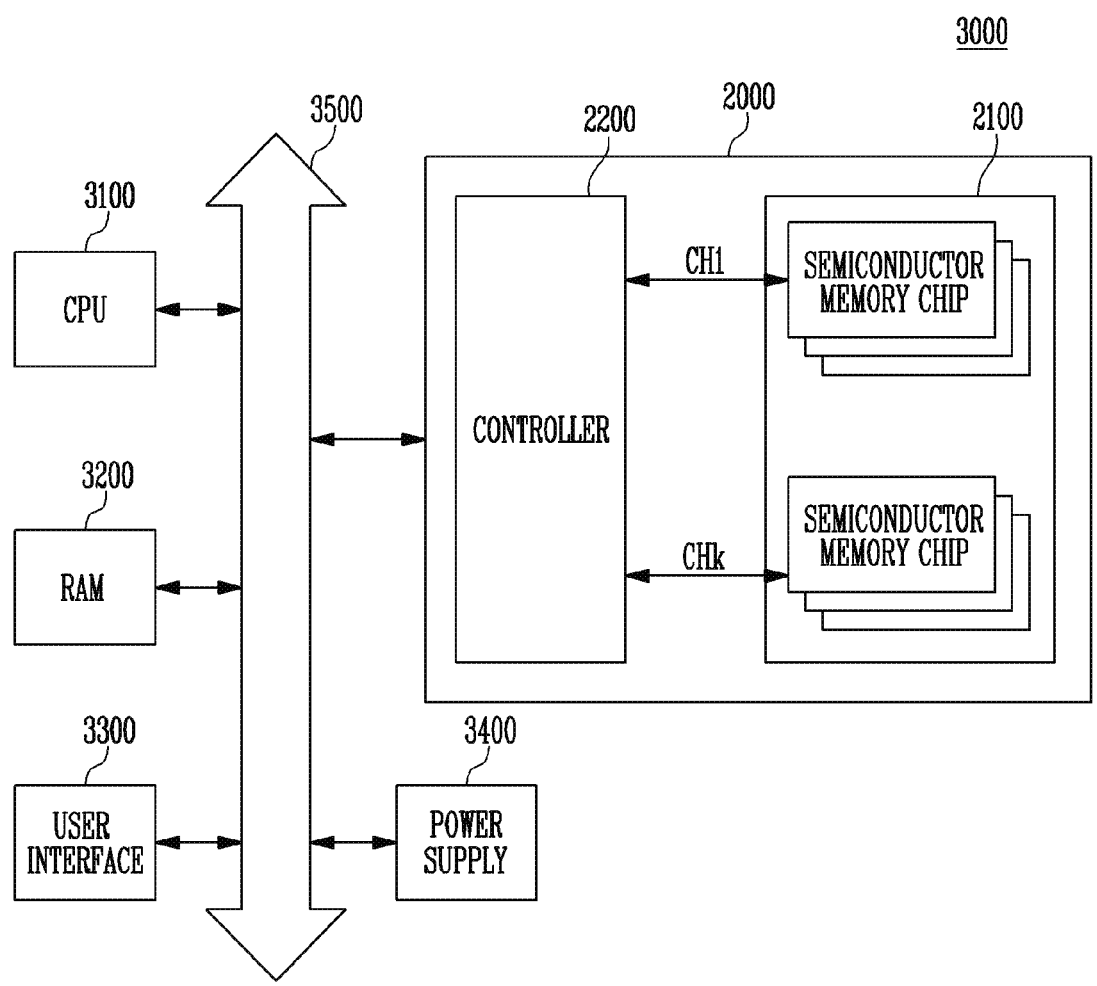
FIG. 21 is a block diagram illustrating a computing system including the memory system illustrated with reference to FIG. 20.

FIG. 21 is a block diagram illustrating a computing system 3000 including the memory system illustrated with reference to FIG. 20.

The computing system 3000 may include a central processing unit (CPU) 3100, a RAM 3200, a user interface 3300, a power supply 3400, a system bus 3500, and the memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 21, the semiconductor memory device 2100 has been illustrated as being coupled to the system bus 3500 through the controller 2200. Furthermore, the semiconductor memory device 2100 may be directly coupled to the system bus 3500. The function of the controller 2200 may be performed by the CPU 3100 and the RAM 3200.

In FIG. 21, it is illustrated that the memory system 2000 described with reference to FIG. 20 is provided. However, the memory system 2000 may be replaced with the memory system 1000 described with reference to FIG. 19. In an embodiment, the computing system 3000 may be formed of both the memory systems 1000 and 2000 described with reference to FIGS. 19 and 20.

Various embodiments of the present disclosure may provide a semiconductor memory device having enhanced read performance.

Various embodiments of the present disclosure may provide a method of operating a semiconductor memory device having enhanced read performance.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory apparatus comprising:
a memory cell array including a plurality of memory cells;
a peripheral circuit configured to perform a program operation on selected memory cells among the plurality of memory cells;
control logic configured to control an operation of the peripheral circuit,
wherein the control logic controls the peripheral circuit to perform a pre-program operation on first memory cells to be programmed to an upper programmed state among the selected memory cells and perform a normal program operation on the selected memory cells after the pre-program operation.

2. The semiconductor memory apparatus according to claim 1, wherein, during the pre-program operation, the control logic controls the peripheral circuit to apply a program enable voltage to each of bit lines coupled with the first memory cells, apply a program inhibit voltage to each of bit lines coupled with second memory cells other than the first memory cells among the selected memory cells, and apply a pre-program pulse to a selected word line coupled with the selected memory cells.

3. The semiconductor memory apparatus according to claim 2, wherein the program enable voltage is a voltage lower than the program inhibit voltage.

4. The semiconductor memory apparatus according to claim 2, wherein the control logic controls the peripheral circuit such that a program pass voltage is applied to an unselected word line while the pre-program pulse is applied to the selected word line.

5. The semiconductor memory apparatus according to claim 2, wherein the control logic controls the peripheral circuit such that, while the pre-program pulse is applied to the selected word line, a first program pass voltage is applied to a first unselected word line disposed adjacent to the selected word line, and a second program pass voltage is applied to a second unselected word line other than the first unselected word line.

6. The semiconductor memory apparatus according to claim 5, wherein a voltage level of the first program pass voltage is greater than a voltage level of the second program pass voltage.

7. The semiconductor memory apparatus according to claim 1,
wherein each of the plurality of memory cells comprises a multi-level cell configured to store 2-bit data, and each of the selected memory cells is programmed to have a threshold voltage corresponding to any one of an erased state and first to third programmed states, and
wherein the upper programmed state includes the third programmed state.

8. The semiconductor memory apparatus according to claim 1,
wherein each of the plurality of memory cells comprises a multi-level cell configured to store 2-bit data, and each of the selected memory cells is programmed to have a threshold voltage corresponding to any one of an erased state, a first programmed state, a second programmed state, and a third programmed state, and
wherein the upper programmed state includes the second and the third programmed states.

9. The semiconductor memory apparatus according to claim 1,
wherein each of the plurality of memory cells comprises a triple-level cell configured to store 3-bit data, and each of the selected memory cells is programmed to have a threshold voltage corresponding to any one of an erased state and first to seventh programmed states, and
wherein the upper programmed state includes the seventh programmed state.

10. The semiconductor memory apparatus according to claim 1,
wherein each of the plurality of memory cells comprises a triple-level cell configured to store 3-bit data, and each of the selected memory cells is programmed to have a threshold voltage corresponding to any one of an erased state and first to seventh programmed states, and
wherein the upper programmed state includes the sixth and the seventh programmed states.

11. A method of operating a semiconductor memory device including a plurality of memory cells, the method comprising:
performing a pre-program operation on at least some memory cells included in a selected physical page among the plurality of memory cells; and performing a normal program operation on the memory cells included in the selected physical page, wherein performing the pre-program operation comprises pre-programming memory cells to be programmed to an upper programmed state among the memory cells included in the selected physical page.

12. The method according to claim 11, wherein performing the pre-program operation comprises:

setting respective bit line voltages to be applied to bit lines coupled with the memory cells included in the selected physical page;

setting program pass voltages to be applied to unselected word lines that are not coupled with the selected physical page; and applying a pre-program pulse to a selected word line coupled with the selected physical page.

13. The method according to claim 12, wherein setting the respective bit line voltages comprises:

applying a program enable voltage to each of bit lines coupled with first memory cells to be programmed to the upper programmed state among the memory cells included in the selected physical page; and applying a program inhibit voltage to each of bit lines coupled with second memory cells other than the first memory cells among the memory cells included in the selected physical page.

14. The method according to claim 12, wherein setting the program pass voltages comprises:

applying a first program pass voltage to each of first unselected word lines disposed adjacent to the selected word line among the unselected word lines; and applying a second program pass voltage to each of second unselected word lines other than the first unselected word lines among the unselected word lines.

15. The method according to claim 14, wherein a voltage level of the first program pass voltage is greater than a voltage level of the second program pass voltage.

16. The method according to claim 11, wherein each of the plurality of memory cells comprises a multi-level cell configured to store 2-bit data, and each of the selected memory cells is programmed to have a threshold voltage corresponding to any one of an erased state and first to third programmed states, and wherein the upper programmed state includes the third programmed state.

17. The method according to claim 11, wherein each of the plurality of memory cells comprises a multi-level cell configured to store 2-bit data, and each of the selected memory cells is programmed to have a threshold voltage corresponding to any one of an erased state, a first programmed state, a second programmed state, and a third programmed state, and wherein the upper programmed state includes the second and the third programmed states.

18. The method according to claim 11, wherein each of the plurality of memory cells comprises a triple-level cell configured to store 3-bit data, and each of the selected memory cells is programmed to have a threshold voltage corresponding to any one of an erased state and first to seventh programmed states, and wherein the upper programmed state includes the seventh programmed state.

19. The method according to claim 11, wherein each of the plurality of memory cells comprises a triple-level cell configured to store 3-bit data, and each of the selected memory cells is programmed to have a threshold voltage corresponding to any one of an erased state and first to seventh programmed states, and wherein the upper programmed state includes the sixth and the seventh programmed states.

* * * * *